United States Patent [19]
Weller

[11] Patent Number: 6,064,312
[45] Date of Patent: May 16, 2000

[54] METHOD AND APPARATUS FOR AUTOMATIC VERIFICATION OF MEASUREMENT PROBE FUNCTIONALITY AND COMPENSATION

[75] Inventor: Dennis J. Weller, Colorado Springs, Colo.

[73] Assignee: Hewlett-Packard Company, Palo Alto, Calif.

[21] Appl. No.: 09/127,488

[22] Filed: Jul. 31, 1998

[51] Int. Cl.[7] ................................... G08B 21/00
[52] U.S. Cl. ............... 340/653; 340/516; 324/76.12; 324/73.1; 324/527; 324/606
[58] Field of Search .................... 340/653, 635, 340/516; 324/76.12, 149, 73.1, 527, 606, 690

[56] References Cited

U.S. PATENT DOCUMENTS

| | | | |
|---|---|---|---|
| 4,253,057 | 2/1981 | Carlton et al. | 324/76.12 |
| 4,283,720 | 8/1981 | Herledan | 340/653 |
| 4,649,336 | 3/1987 | Bindner et al. | 324/76.12 |
| 4,719,408 | 1/1988 | Carlton | 324/76.12 |
| 5,789,925 | 8/1998 | Yokotani et al. | 324/500 |

*Primary Examiner*—Jeffery A. Hofsass
*Assistant Examiner*—Toan Pham

[57] ABSTRACT

Method and apparatus for automatic verification of measurement probe functionality and compensation for a wide range of oscillating signal amplitude levels. The invention includes a source of an oscillating signal and a measurement device. A measurement probe is coupled between the measurement device and the source of the oscillating signal, wherein it is desired that the probe is functioning to faithfully transmit the oscillating signal there through. The measurement device is adapted for generating a measurement signal in response to the source of the oscillating signal. Also included is a reference that is based upon actual characteristics of the oscillating signal. A controller is coupled with the measurement device and the reference for making a comparison of the measurement signal to the reference. The controller automatically determines whether the measurement probe is functioning based upon the comparison.

23 Claims, 1 Drawing Sheet

METHOD AND APPARATUS FOR AUTOMATIC VERIFICATION OF MEASUREMENT PROBE FUNCTIONALITY AND COMPENSATION

FIELD OF THE INVENTION

The invention generally relates to the field of measurement probes and more particularly to automatic verification of probe functionality and compensation.

BACKGROUND OF THE INVENTION

It is a fundamental concept of systems theory that every system or subsystem is characterized by a frequency response to a stimulating spectrum of signals. Some subsystems, such as measurement probes, include a tunable frequency compensation network. The compensation network of the probes is adjustable for a substantially flat frequency response, so as to provide for accurate measurements, when measurements are made using an instrument, such as an oscilloscope, coupled through the measurement probes to a device under test. In general, failure to make adequate adjustments to the probe compensation may cause undesirable measurement errors.

Various manual ways of adjusting probe compensation are known in the prior art. For example, after a probe is coupled with an oscilloscope input, an operator of the oscilloscope manually verifies that the probe is functioning correctly and is correctly compensated, by manually connecting the probe to a compensation signal source provided on a front panel of the oscilloscope. The oscilloscope provides a display and measurement of the compensation signal, so that the operator can deliberate and determine whether the probe is functioning correctly and is correctly compensated.

While the prior art provides some advantages, some limitations still remain. In particular, since the probe compensation signal source shares a common ground with the oscilloscope input, this method does not verify that a ground lead of the probe is functional, and therefore does not provide sufficient information for the operator to determine whether the probe is functioning correctly. Because of this, the operator must expend additional effort and manually verify that the ground lead is also functional by some other method, such as, for example, measuring the ground lead with an ohmmeter, or shorting the signal at the probe signal lead with the ground lead.

Additionally, it should be noted that on typical oscilloscopes, the compensation signal has a fixed amplitude. Accordingly, the manual method of the prior art has limited flexibility, since the probe is verified for only a limited amount of the fixed amplitude.

Another limitation is that the manual method of the prior art is time consuming, on the order of one to two minutes of time for each probe. Furthermore the manual method of the prior art is subject to errors caused by an inattentive or untrained operator. There is an unfortunate synergy between these two factors. Because of the time required, the operator may be more prone to errors, or may even skip verification of probe functionality and compensation altogether, in order to save time. Paradoxically, skipping probe verification may result in even more time lost, because the operator may make measurements for many minutes before realizing that the probe is not functioning correctly. This is especially true if the probe ground lead is faulty.

What is needed is an accurate, quick, simple, and easy to use method and apparatus for automatic verification of measurement probe functionality and compensation for a wide range of signal amplitude levels.

SUMMARY OF THE INVENTION

The invention provides an accurate, quick, simple, and easy to use method and apparatus for automatic verification of measurement probe functionality and compensation for a wide range of oscillating signal amplitude levels.

Because of the simplicity and quickness of probe verification that the invention provides, an operator will be more likely to verify probe functionality before starting a series of measurements. Because of this, the operator is less likely to waste time making measurements with a probe that is not functioning correctly. The operator will have more confidence that the measurements they are making are accurate. Furthermore, in accordance with the principles of the invention: a ground lead of the probe is automatically tested in isolation, so as to accurately determine whether the ground lead is functioning correctly; and the probe is automatically verified using various oscillating signal amplitude levels.

Briefly and in general terms, the invention includes a source of an oscillating signal and a measurement device. A measurement probe is coupled between the measurement device and the source of the oscillating signal, wherein it is desired that the probe is functioning to faithfully transmit the oscillating signal there through.

The measurement device is adapted for generating a measurement signal in response to the source of the oscillating signal. The measurement signal varies, depending upon how faithfully the probe transmits the oscillating signal from the source.

Also included is a reference that is based upon actual characteristics of the oscillating signal. A controller is coupled with the measurement device and the reference for making a comparison of the measurement signal to the reference. The controller automatically determines whether the measurement probe is functioning based upon the comparison.

The source of the oscillating signal is coupled with the controller and adapted for varying the amplitude of the oscillating signal to various amplitude levels. The controller is adapted for automatically selecting from among the various amplitude levels, and adapted for automatically determining whether the measurement probe is functioning for the various amplitude levels of the oscillating signal.

The measurement device has a ground connection. The measurement probe includes a signal lead and a ground lead coupled with the source of the oscillating signal. In accordance with the principles of the invention, the ground lead of the measurement probe is automatically isolated from the ground connection of the measurement device.

Other aspects and advantages of the present invention will become apparent from the following detailed description, taken in conjunction with the accompanying drawings, illustrating by way of example the principles of the invention.

DETAILED DESCRIPTION OF THE PREFERRED EMBODIMENT

Figure 1:
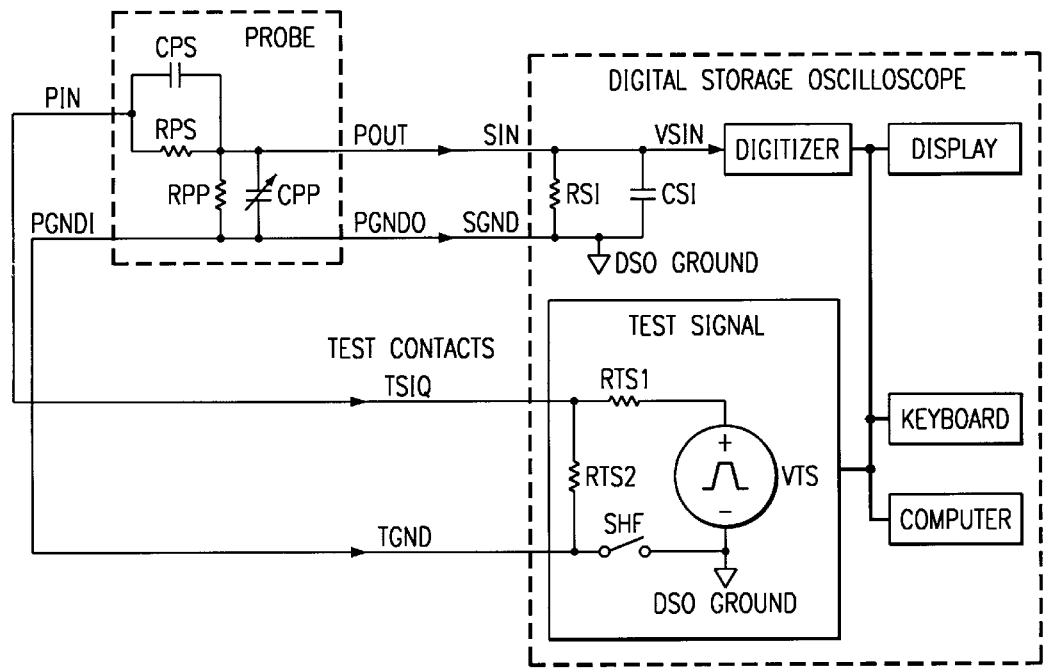
FIG. 1 is a simplified block diagram illustrating a preferred embodiment of the invention.

FIG. 1 is a simplified block diagram illustrating a preferred embodiment of the invention. The measurement probe block (designated as probe in FIG. 1) is representative of a typical oscilloscope divider probe. Contained within the probe is a resistive voltage divider, made up of resistors Rps and Rpp interconnected in a first voltage divider configuration, and a capacitive voltage divider, made up of Cps and Cpp interconnected in a second voltage divider configuration.

The probe has a pair of inputs: the probe signal lead, Pin, and the probe ground lead, Pgndi. Each member of a pair of outputs of the probe divider, Pout and Pgndo, are respectively coupled to a pair of inputs, Sin and Sgnd, of a Digital Storage Oscilloscope (hereon referred to as DSO). A variable capacitor, Cpp, is adjusted to compensate the probe, so that the AC attenuation of the probe matches the DC attenuation. In the preferred embodiment of the invention, two test contacts, Tsig and Tgrnd on the front panel of the oscilloscope, DSO, are used by an operator of the oscilloscope for coupling with the probe. It should be understood that the invention is not limited to divider probes, since alternative probe types can be used in conjunction with the invention with beneficial results. Moreover, it should be understood the invention is not limited to use for DSO's, since the invention may be used advantageously in conjunction with other measurement instruments, such as, but not limited to, analog oscilloscopes, combination analogidigital oscilloscopes, waveform recorders, or waveform digitizers.

The invention includes a source of an oscillating signal, designated as the test signal shown in FIG. 1. The test signal drives the test contacts, Tsig and Tgnd, with the source of the oscillating signal, preferably an AC square wave oscillating signal source, Vts, through coupled resistors, Rts1 and Rts2. The frequency of the source, Vts is typically between 1 kHz to 10 kHz. It should be understood that the invention is not strictly limited to the source providing a square wave. For example, a source of a variable frequency sine wave or a pulse generator may be used for the source, Vts, with beneficial results.

In general terms, the invention includes a measurement device. The measurement probe is coupled between the measurement device and the source of the oscillating signal, wherein it is desired that the probe is functioning to faithfully transmit the oscillating signal there through.

The measurement device is adapted for generating a measurement signal in response to the source of the oscillating signal. The measurement signal varies, depending upon how faithfully the probe transmits the oscillating signal from the source.

Also included is a reference that is based upon actual characteristics of the oscillating signal. A controller is coupled with the measurement device and the reference for making a comparison of the measurement signal to the reference. The controller automatically determines whether the measurement probe is functioning based upon the comparison.

In the preferred embodiment, the measurement device for generating the measurement signal includes a digitizer for generating data values of the measurement signal, as shown in FIG. 1. The reference includes data values, stored in a memory of the controller, and based upon actual characteristics of the oscillating signal. The controller is adapted for comparing data values of the measurement signal to data values of the reference. It should be understood that the measurement device is not strictly limited to the preferred embodiment of the invention as shown in FIG. 1, since the measurement device of the invention may be otherwise embodied, for example, but not limited to, using a voltmeter or an analog comparator, with beneficial results.

In the preferred embodiment, the reference is based upon the actual amplitude of the oscillating signal. The controller is adapted for comparing the measurement signal to the reference, based upon the amplitude of the oscillating signal. However, it should be understood that the invention is not limited to such an embodiment. For example, in an alternative embodiment, the controller is adapted for generating a frequency domain representation of the measurement signal, by using, for example a Fast Fourier Transform (FFT). The reference is based upon a frequency domain representation of the oscillating signal. In such a case, the controller is adapted for comparing the frequency domain representation of the measurement signal to the reference based upon the frequency domain representation of the reference. In another alternative embodiment, the controller is adapted for generating a histogram based on data values of the measurement signal. The reference is based upon a histogram of the oscillating signal. In such case, the controller is adapted for comparing the histogram of the measurement signal to the histogram of the reference.

The controller, preferably a computer or one or more suitably programmed microprocessors, is programmed to unload and process the measurement signal from the digitizer, and plots the oscillating signal data as a waveform on a display coupled with the controller. However, it should be understood that the controller is not strictly limited to computers or microprocessors. Alternative computational circuits or systems such as, but not limited to, a FPGA (field programmable gate array) or an ASIC (application specific integrated circuit) may be employed with beneficial results.

The amplitude of the source, Vts is automatically varied by the controller, coupled thereto, to test the probe's operation for all input ranges of the DSO. The source of the oscillating signal is coupled with the controller and adapted for varying the amplitude of the oscillating signal to various amplitude levels. The controller is programmed for automatically selecting from among the various amplitude levels, and programmed for automatically determining whether the measurement probe is functioning for the various amplitude levels of the oscillating signal.

As shown in FIG. 1, the DSO's input, Sin, is connected to the probe. An input resistor, Rsi, and an input capacitor, Csi, comprise the DSO's input impedance. The measurement device has a ground connection, DSO Ground, coupled with the input resistor, Rsi and the input capacitor, Csi. The input, Sin, is digitized by the digitizer. The measurement probe includes the input signal lead, Pin, and the ground lead, Pgndi, coupled with the source of the oscillating signal. In accordance with the principles of the invention, the ground lead of the measurement probe, Pgndi, is automatically isolated from the ground connection of the measurement device, DSO Ground.

It should be noted that in the preferred embodiment, the source, Vts, is connected to the same DSO Ground as the measurement input, Sgnd. The ground lead of the probe, Pgndi, coupled with the ground of the test contact, Tgnd, is automatically isolated from the ground connection of the measurement device, DSO Ground. In the preferred embodiment, a switch, Shf, is coupled between the ground lead Pgndi, and the ground connection of the measurement device, DSO Ground shown in FIG. 1. The switch is coupled with the controller to automatically control the switch, so as to selectively and automatically isolate the ground lead, Pgndi, from the ground connection of the measurement device, DSO Ground. The switch Shf is closed to establish a low impedance connection between the probe ground lead Pgndi, and the source Vts, necessary for high frequency performance verification. Preferred implementations of switch Shf include, but are not limited to, a mechanical relay or a solid state switch.

A keyboard provides for the operator to initialize various functions of the DSO. The operator initiates automatic verification by pressing a button, for example, on the keyboard, which is coupled with the controller as shown in FIG. 1. In response, the invention automatically determines whether the probe is functioning correctly and is correctly compensated. The invention then quickly analyzes the oscillating signal from the probe, and provides the operator with a report of the verification using an indicator, preferably a display, coupled with the controller, as shown in FIG. 1.

This report would include, but not be limited to, items such as, probe good, probe bad, open ground lead, open signal lead, shorted probe, improper compensation, out of specification. In the preferred embodiment, the oscilloscope is adapted for sensing the probe's attenuation factor, so that the invention can test the accuracy of the probe. The amplitude of the oscillation signal of the test signal is measured over a range of frequencies by the controller using the digitizer. This testing is done for all input ranges of the oscilloscope, verifying that the probe is functional and accurate over a wide range of voltages. The controller uses these measurements to verify functionality, attenuation, compensation, bandwidth, and flatness performance. It is theorized that the time required to perform this probe verification procedure would typically be less than 15 seconds.

It should be understood that the invention is not limited to using the keyboard to initiate the automatic verification of the probe. Other ways to provide for such initiation, for example using a voice processor in response to a voice command, may be used with beneficial results. Another example to provide for such initiation employs the controller automatically sensing the probe's connection to the test contacts, using a mechanical and/or electrical technique, to automatically initiate probe verification procedure, without requiring operator interaction.

It should also be understood that the invention is not strictly limited to using the display as the verification indicator, since other visual indicators such as LED's (light emitting diodes), a LCD (Liquid Crystal Display) character display, or a LCD graphic display may be employed with beneficial results. As another example, audible indicators may be employed, wherein the results of the probe verification procedure are indicated by audio sound such as, but not limited to, a multi-tone beep or a synthesized voice.

The following procedure is used to verify the probe's functionality, attenuation, and compensation performance at lower frequencies. The switch, Shf is open for this test. The operator connects the probe signal lead, Pin, to the signal test contact, Tsig, and connects the probe ground lead, Pgndi, to the ground test contact, Tgnd. It should be noted that this results in one side of resistor, Rts2, being grounded to the ground connection of the measurement device, DSO Ground, forming a voltage divider with Rts1, resulting in the amplitude of the oscillating signal at the signal test contact, Tsig, being less than the amplitude provided by the signal source, Vts. The operator presses a key on the keyboard, signaling the controller to use the digitizer to measure the RMS (Root Mean Square amplitude) voltage of what is transmitted through the measurement probe, to the digitizer from the source. If the probe is functional and properly compensated, then the expected RMS voltage at Sin, which is designated as Vsin, can be derived using circuit analysis to be:

$$V_{sin} = V_{vts}/(1/Rts2 + 1/(Rps + 1/(1/Rpp + 1/Rsi)))/(1/(1/Rts2 + 1/(Rps + 1/(1/Rpp + 1/Rsi))) + Rts1)/(1/Rpp + 1/Rsi)/(1/(1/Rpp + 1/Rsi) + Rps)/2$$

If the measured voltage differs from the expected voltage less than a tolerance band, then the controller signals the operator that the probe is good via the display. If the probe is under-compensated (overshoot), the measured root-mean-square amplitude (RMS) voltage will be higher than expected. Likewise, an over-compensated probe (undershoot) will measure lower than expected. An alternative method to measuring RMS voltage is used to determine the probe's performance. Such methods include, but are not limited to, using the controller to generate and analyze a histogram of the oscillating signal, or using the controller to comparing digitized values the oscillating signal to a reference values of a reference waveform stored in the memory of the controller.

If the probe is defective due to an open signal lead, either Pin or Pout, then the measured voltage would be much lower than expected. A short between a signal lead, either Pin or Pout, to either Pgndi or Pgndo will also result in a much lower than expected measurement signal, detected by the controller.

If the probe ground lead, Pgnd, is open between Pgndi and Pgndo, the measured voltage will be much higher than expected since resistor, Rts2, would not be grounded. Normally the resistor, Rts2, is grounded via the probe ground Pgndi and Pgndo, forming a voltage divider with Rts1 whose output is the Test Signal, Tsig.

If the probe is defective due to shorted or open components in the probe, then the measurement signal will also be higher or lower than expected. The controller signals the operator via the Display, of such problems with the probe.

Verifying the probe's bandwidth and flatness performance at higher frequencies is done as follows. Switch, Shf, is closed. Using the digitizer, the controller measures the risetime, falltime, overshoot, and undershoot of the oscillating signal as it is coupled by the probe, Sin. The controller then determines if these measurements are within tolerance in comparison with the reference, and displays a message on the display. The controller performs the verification procedure for all input ranges of the DSO, by varying the amplitude of the Test Signal source, Vts, and testing the probe's functionality for each input range of the DSO.

Figure 2:
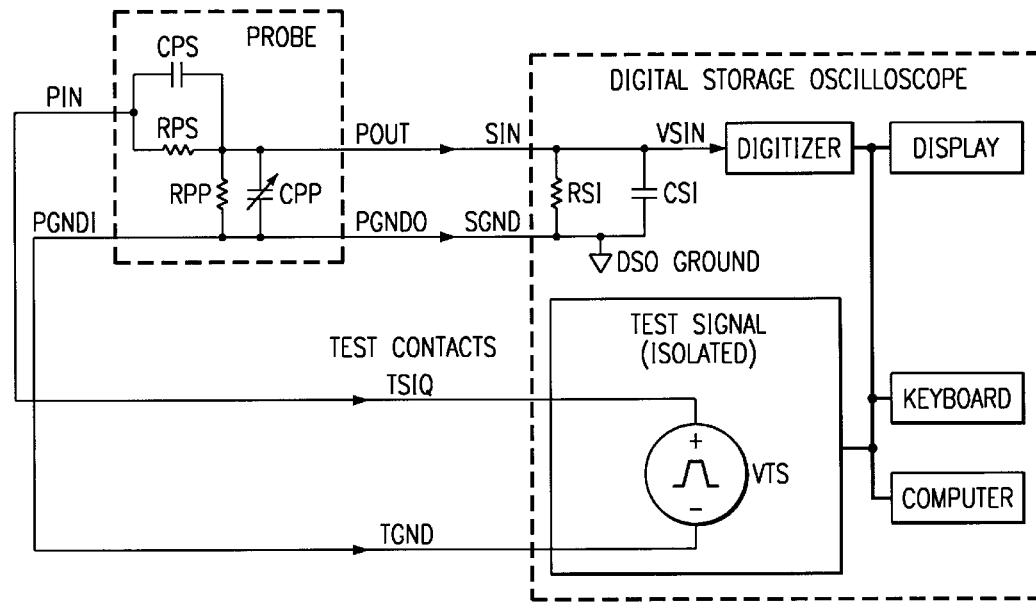
FIG. 2 is a simplified block diagram illustrating another preferred embodiment of the invention.

FIG. 2 is a simplified block diagram illustrating another preferred embodiment of the invention, generally similar to the embodiment shown in FIG. 1, except that the signal, Test Signal is electrically isolated from the DSO Ground and the DSO's input signals, Sin and Sgnd, without using any switch. In this embodiment, if the probe has a defect of an open ground lead, Pgndi or Pgndo, this will be detected using the invention, as a lower than expected measurement signal.

As discussed, the invention provides an accurate, quick, simple, and easy to use method and apparatus for automatic verification of measurement probe functionality and compensation for a wide range of oscillating signal amplitude levels. Although specific embodiments of the invention have been described and illustrated, the invention is not to be limited to the specific forms or arrangements or parts so described and illustrated, and various modifications and changes can be made without departing from the scope and spirit of the invention. Within the scope of the appended claims, therefor, the invention may be practiced otherwise than as specifically described and illustrated.

What is claimed is:

1. A method comprising the steps of:

providing a measurement probe coupled between a source of an oscillating signal and a measurement device, and further providing a controller coupled with the measurement device, and coupled with a reference that is based upon actual characteristics of the oscillating signal, wherein it is desired that the probe is functioning to faithfully transmit the oscillating signal from the source to the measurement device;

generating a measurement signal using the measurement device in response to the source of the oscillating signal, wherein the measurement signal varies, depending upon how faithfully the probe transmits the oscillating signal from the source;

automatically comparing the measurement signal to the reference using the controller;

automatically determining whether the measurement probe is functioning by using the controller, based upon the comparing of the measurement signal to the reference.

2. A method as in claim 1 wherein the step of automatically determining whether the measurement probe is functioning includes automatically determining whether the probe is frequency compensated for the oscillating signal.

3. A method as in claim 1 wherein:

the oscillating signal has an amplitude;

the reference, which is based upon actual characteristics of the oscillating signal, is based upon the amplitude of the oscillating signal; and the step of automatically comparing the measurement signal to the reference includes comparing the measurement signal to the reference based upon the amplitude of the oscillating signal.

4. A method as in claim 1 wherein:

the source of the oscillating signal is coupled with the controller and adapted for varying amplitude of the oscillating signal to various amplitude levels;

the method further comprises a step of automatically selecting from among the various amplitude levels by using the controller; and the step of automatically determining whether the measurement probe is functioning includes determining whether the measurement probe is functioning for the various amplitude levels of the oscillating signal.

5. A method as in claim 1 wherein:

the step of generating the measurement signal includes generating data values of the measurement signal; and the step of comparing the measurement signal to the reference includes comparing data values of the measurement signal to data values of the reference.

6. A method as in claim 1 wherein:

the measurement device has a ground connection;

the measurement probe includes a signal lead and a ground lead coupled with the source of the oscillating signal; and further comprising the step of automatically isolating the ground lead from the ground connection.

7. A method as in claim 6 wherein the step of automatically determining whether the measurement probe is functioning includes automatically determining whether the ground lead of the measurement probe is functioning.

8. A method as in claim 6 wherein the step of automatically isolating the ground lead from the ground connection includes using the controller to automatically control a switch coupled between the ground lead and the ground connection.

9. A method as in claim 1 wherein:

the method further comprises a step of generating a frequency domain representation of the measurement signal using the controller;

the reference, which is based upon actual characteristics of the oscillating signal, is based upon a frequency domain representation of the oscillating signal; and the step of comparing includes comparing the frequency domain representation of the measurement signal to the reference based upon the frequency domain representation of the reference.

10. A method as in claim 1 wherein:

the method further comprises a step of generating a histogram based upon data values of the measurement signal;

the reference, which is based upon actual characteristics of the oscillating signal, is based upon a histogram of the oscillating signal; and the step of comparing includes comparing the histogram of the measurement signal to the histogram of the reference.

11. An apparatus comprising:

a source of an oscillating signal;

a measurement device;

a measurement probe coupled between the measurement device and the source of the oscillating signal, wherein it is desired that the probe is functioning to faithfully transmit the oscillating signal there through, and wherein the measurement device is adapted for generating a measurement signal in response to the source of the oscillating signal;

a reference that is based upon actual characteristics of the oscillating signal; and a controller coupled with the measurement device and the reference for making a comparison of the measurement signal to the reference, and adapted for automatically determining whether the measurement probe is functioning based upon the comparison.

12. An apparatus as in claim 11 wherein the controller is adapted for automatically determining whether the probe is frequency compensated for the oscillating signal.

13. An apparatus as in claim 11 wherein:

the oscillating signal of the source has an amplitude;

the reference, which is based upon actual characteristics of the oscillating signal, is based upon the amplitude of the oscillating signal; and the controller is adapted for comparing the measurement signal to the reference based upon the amplitude of the oscillating signal.

14. An apparatus as in claim 11 wherein:

the source of the oscillating signal is coupled with the controller and adapted for varying the amplitude of the oscillating signal to various amplitude levels; and the controller is adapted for automatically selecting from among the various amplitude levels, and adapted for automatically determining whether the measurement probe is functioning for the various amplitude levels of the oscillating signal.

15. An apparatus as in claim 11 wherein:

the measurement device for generating the measurement signal includes a digitizer for generating data values of the measurement signal;

the reference includes data values based upon actual characteristics of the oscillating signal; and the controller is adapted for comparing data values of the measurement signal to data values of the reference.

16. An apparatus as in claim 11 wherein:

the measurement device has a ground connection;

the measurement probe includes a signal lead and a ground lead coupled with the source of the oscillating signal; and the ground lead is automatically isolated from the ground connection.

17. An apparatus as in claim 16 wherein the controller is adapted for automatically determining whether the ground lead of the measurement probe is functioning.

18. An apparatus as in claim 16 further comprising a switch coupled between the ground lead and the ground connection, wherein the switch is coupled with the controller to automatically controling the switch, so as to selectively and automatically isolate the ground lead from the ground connection.

19. An apparatus as in claim 11 wherein:

the controller is adapted for generating a verification signal, based upon the controller automatically determining whether the measurement probe is functioning; and the apparatus further comprises an indicator coupled with the controller for receiving the verification signal, and adapted for signaling an operator, so as to automatically communicate with the operator whether the measurement probe is functioning.

20. An apparatus as in claim 19 wherein:

the indicator includes a display coupled with the controller for receiving the verification signal, and for displaying a message to communicate with the operator whether the measurement probe is functioning.

21. An apparatus as in claim 11 wherein the measurement device comprises a voltmeter for measuring the amplitude of the oscillating signal.

22. An apparatus as in claim 11 wherein:

the controller is adapted for generating a frequency domain representation of the measurement signal;

the reference, which is based upon actual characteristics of the oscillating signal, is based upon a frequency domain representation of the oscillating signal; and the controller is adapted for comparing the frequency domain representation of the measurement signal to the reference based upon the frequency domain representation of the reference.

23. An apparatus as in claim 11 wherein:

the controller is adapted for generating a histogram based upon data values of the measurement signal;

the reference, which is based upon actual characteristics of the oscillating signal, is based upon a histogram of the oscillating signal; and the controller is adapted for comparing the histogram of the measurement signal to the histogram of the reference.

* * * * *